(12) United States Patent
Marinov et al.

(10) Patent No.: US 9,862,141 B2
(45) Date of Patent: Jan. 9, 2018

(54) SELECTIVE LASER-ASSISTED TRANSFER OF DISCRETE COMPONENTS

(71) Applicant: NDSU RESEARCH FOUNDATION, Fargo, ND (US)

(72) Inventors: Val R. Marinov, Fargo, ND (US); Orven Swenson, Fargo, ND (US); Mark Pavicic, Fargo, ND (US); Ross A. Miller, Moorhead, MN (US); Zhigang Chen, Fargo, ND (US); Ferdous Sarwar, Fargo, ND (US); Matthew R. Semler, Appleton, MN (US)

(73) Assignee: NDSU RESEARCH FOUNDATION, Fargo, ND (US)

( * ) Notice: Subject to any disclaimer, the term of this patent is extended or adjusted under 35 U.S.C. 154(b) by 184 days.

(21) Appl. No.: 14/968,562

(22) Filed: Dec. 14, 2015

(65) Prior Publication Data

US 2017/0313044 A1 Nov. 2, 2017

Related U.S. Application Data

(60) Division of application No. 14/046,809, filed on Oct. 4, 2013, which is a continuation of application No. PCT/US2012/033147, filed on Apr. 11, 2012.

(Continued)

(51) Int. Cl.
*B32B 37/14* (2006.01)
*B29C 65/16* (2006.01)
(Continued)

(52) U.S. Cl.
CPC .......... *B29C 65/1606* (2013.01); *B29C 65/16* (2013.01); *B29C 65/1635* (2013.01);
(Continued)

(58) Field of Classification Search
CPC ....... H01L 2924/00; H01L 2924/10253; H01L 2924/12042; H01L 2924/1461;
(Continued)

(56) References Cited

U.S. PATENT DOCUMENTS 6,204,092 B1 3/2001 Freund et al.
1,423,286 A1 9/2008 Handy et al.
(Continued)

FOREIGN PATENT DOCUMENTS

CN 1264851 A 8/2000
EP 1033393 A2 8/1994
(Continued)

OTHER PUBLICATIONS

Korean Intellectual Property Office, International Search Report and Written Opinion dated Dec. 14, 2012 for corresponding international patent application No. PCT/US2012/033147 (pp. 1-9) with claims searched (pp. 10-14) pp. 1-14. The degree of relevance of the non-English language reference listed above, KR 10-0374469, is set forth in this English-language search report and, therefore, a separate concise explanation of the relevance is not required.

(Continued)

*Primary Examiner* — Sonya Mazumdar
(74) *Attorney, Agent, or Firm* — O'Banion & Ritchey LLP; John P. O'Banion

(57) ABSTRACT

Electronic components are often assembled using robotic equipment, such as pick-and-place machines, that is not optimized for components such as ultra-thin semiconductor bare dice. Selective laser-assisted die transfer is described based on the unique blistering behavior of a multilayer dynamic release layer when irradiated by low energy focused laser pulse(s) in which the blister creates translation of the article being placed. Accurate placement results are provided with negligible lateral and angular displacement.

14 Claims, 7 Drawing Sheets

Related U.S. Application Data

(60) Provisional application No. 61/473,988, filed on Apr. 11, 2011.

(51) Int. Cl.
*H01L 21/683* (2006.01)
*B32B 38/10* (2006.01)
*B32B 37/00* (2006.01)
*H01L 21/68* (2006.01)

(52) U.S. Cl.
CPC ........ *H01L 21/6835* (2013.01); *B32B 37/025* (2013.01); *H01L 21/68* (2013.01)

(58) Field of Classification Search
CPC ....... H01L 2924/3512; H01L 21/67132; H01L 21/6835; H01L 2221/68318; H01L 2221/68322; H01L 2221/68327; H01L 2221/68363; H01L 2221/68381; H01L 2224/83001; H01L 2224/83192; H01L 2224/8385; H01L 24/83; H01L 2924/01029; B29C 65/16; B29C 65/1606; B29C 65/1635; B32B 37/025
USPC .............................................. 156/272.8, 712
See application file for complete search history.

(56) References Cited

U.S. PATENT DOCUMENTS

| | | |
|---|---|---|
| 2005/0054121 A1 | 3/2005 | Handy et al. |
| 2005/0155699 A1 | 7/2005 | Hayashi |
| 2008/0210368 A1 | 9/2008 | Zakel et al. |
| 2008/0318030 A1 | 12/2008 | Handy et al. |
| 2010/0072594 A1 | 3/2010 | Kerr et al. |

FOREIGN PATENT DOCUMENTS

| | | |
|---|---|---|
| EP | 1 033 393 A2 | 9/2000 |
| JP | 2003-168825 A | 6/2003 |
| JP | 2006-41500 A | 2/2006 |
| KR | 10-0374469 B1 | 3/2003 |
| NO | 2012/142177 A2 | 10/2012 |

OTHER PUBLICATIONS

Holmes, A. and S. Saidam, "Sacrificial layer process with laser-driven release for batch assembly operations" Journal of Microelectromechanical Systems, 1998. 7(4): p. 416-422.

Mathews, S. et al, "Use of Laser Direct-Write in Microelectronics Assembly," JLMN-Journal of Laser Micro/Nanoengineering 2007, 2(1): p. 103-107.

Piqué, A., H. Kim, and C. Arnold, "Laser forward transfer of electronic and power generating materials," in Laser Ablation and Its Applications, C. Phipps, Editor. 2007, Springer. p. 339-373.

Piqué, A., et al., "Laser direct-write of embedded electronic components and circuits." in Proc. of Photon Processing in Microelectronics and Photonics IV 2005. San Jose, CA: SPIE. p. 223.

Brown, M. S., Kattamis, N. T., & Arnold, C. B. "Time-resolved study of polyimide absorption layers for blister-actuated laser-induced forward transfer," Journal of Applied Physics, 107(8), 2010.

Fardel, R, et al., "Fabrication of organic light-emitting diode pixels by laser-assisted forward transfer," Applied Physics Letters 91, p. 061103, 2007.

Mendes, M., et al., "Lasers in the Manufacturing of LEDs", Jun. 2010 SPIE vol. 7584 p. 75840T-1.

Vogel, A., et al., "Mechanisms of Laser-Induced Dissection and Transport of Histologic Specimens," Biophysical Journal 93 p. 4481-4500, 2007.

Karlitskaya, N., et al., "Laser propulsion of microelectronic components: releasing mechanism investigation," in Proc. of High-Power Laser Ablation VI. 2006. Taos, NM: SPIE vol. 6261. p. 62612.

Pique, A. "Application of laser direct-write for embedding microelectronics," Proc. of SPIE vol. 6606, 66060R, (2007).

Pique, et al., "Assembly and Integration of Thin Bare Die Using Laser Direct-Write," Proc. of SPIE vol. 6458, 645802, paci7).

Pique, et al. "Embedding electronic circuits by laser direct-write," Microelectronic Engineering, vol. 83 (2006) pp. 2527-2533.

Holmes, A.S., "Laser processes for Mems manufacture" RIKEN Review No. 43 (Jan. 2002): Focused on 2nd International Symposium on Laser Precision Microfabrication (LPM2001), pp. 1-7.

Nagel and Lippert, "Laser-Induced Forward Transfer for the Fabrication of Devices" Nanomaterials: Processing and characterization with Lasers, First Edition, Wiley-VCH Verlag GmbH & Co. KGaA. Published 2012 by Wiley-VCH Verlag GmbH & Co. KGaA, pp. 1-62.

Mathews, et al., "Manufacturing Microelectronics Using 'Lase-and-Place'" photonics.com: Oct. 1, 2007, retrieved from http://www.photonics.com/Content/ReadArticle.aspx?ArticleID=31049 on Aug. 11, 2009, pp. 1-6.

J. R. Sheats, "Printing silicon integrated circuits," in Proc. Printed Electronics, San Jose, CA, 2008, pp. 2-5.

Kattarmis, et al., "Thick film laser induced forward transfer for deposition of thermally and mechanically sensitive materials," Applied Physics Letters 91, 171120, Oct. 26, 2014, pp. 103.

European Patent Office, ESSR (European Supplementary Search Report), dated Aug. 22, 2014 for corresponding European Patent Application No. 12 771 676.9 (pp. 1-7) with pending claims (pp. 8-10) pp. 1-10.

State Intellectual Property Office of the People'S Republic of China—Notification of the First Office Action and Claims as examined, app. No. 201280027048.0, dated Dec. 9, 2015, pp. 1-10, counterpart to this application U.S. Appl. No. 14/046,809.

Japanese Patent Office, Notification for Reason for Rejection with English translation and claims as examined, app. No. 2014-505259, dated Feb. 23, 2016, pp. 1-9, counterpart to this application U.S. Appl. No. 14/046,809.

State Intellectual Property Office of the People'S Republic of China, Second Office Action issued Jul. 14, 2016, related CN patent application No. 2012800270480, machine translation pp. 1-1, claims examined pp. 2-7, original communication in Chinese pp. 8-10.

European Patent Office (EPO), Communication pursuant to Article 94(3) EPC dated Sep. 27, 2017, related EPO application no. 12 771 676.9, pp. 1-7, with claims examined, pp. 8-11. Reference D1 cited therein is U.S. Patent Application Publication No. 2005-0155699 already of record.

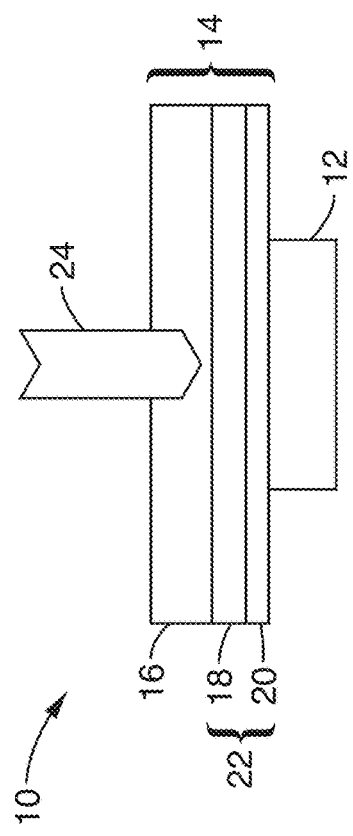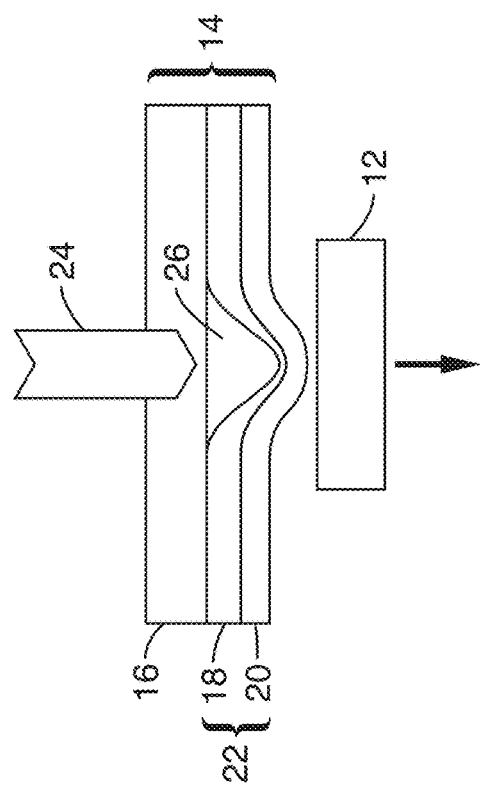
FIG. 1A
FIG. 1B

SELECTIVE LASER-ASSISTED TRANSFER OF DISCRETE COMPONENTS

CROSS-REFERENCE TO RELATED APPLICATIONS

This application is a division of U.S. patent application Ser. No. 14/046,809 filed on Oct. 4, 2013, incorporated herein by reference in its entirety, which is a 35 U.S.C. §111(a) continuation of PCT international application number PCT/US2012/033147 filed on Apr. 11, 2012, incorporated herein by reference in its entirety, which claims priority to, and the benefit of, U.S. provisional patent application Ser. No. 61/473,988 filed on Apr. 11, 2011, incorporated herein by reference in its entirety. Priority is claimed to each of the foregoing applications.

The above-referenced PCT international application was published as PCT International Publication No. WO 2012/142177 on Oct. 18, 2012 and republished on Feb. 28, 2013, which publications are incorporated herein by reference in their entireties.

STATEMENT REGARDING FEDERALLY SPONSORED RESEARCH OR DEVELOPMENT

This invention was made with Government support under Defense Microelectronics Activity (DMEA), Department of Defense Cooperative Agreements Nos. H94003-08-2-0805, H94003-09-2-0905, and H94003-11-2-1102. The Government has certain rights in this invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to electronic manufacturing, and more particularly to laser-induced forward transfer contactless assembly of small components.

2. Description of Related Art

Laser transfer technologies are receiving increasing attention in the industry. Existing technologies, however, suffer from significant drawbacks which limit their applicability. One of the approaches utilized for laser transferring articles involves: (1) attaching the transfer article to a transfer substrate (carrier) by means of a dynamic release layer (DRL), and then (2) ablating a plume of material from the dynamic release layer (DRL) to forcibly eject the article toward a receiving substrate. This method incorporates a dynamic release layer and an adhesive layer to attach the transfer article. The DRL is considered to release the transfer article by changing the physical state of the DRL, for example by vaporization or melting, in response to exposure to the energy source that causes a rapid and localized plume of material ejected from the carrier which projects the transfer article to a receiving substrate. This ablative mechanism for laser-assisted transfer has been described in a number of publications in the field.

However, projecting the transfer article with an ablated plume of material severely limits transfer article placement safety and accuracy. Specifically, in the ablative laser release, the combination of the stochastic nature of the release dynamics and flight instability thwart achieving any consistency in article placement. The lack of positioning precision is inherent for this process when a relatively low density gas is used to push a higher density object.

When higher precision transfer is desired, practical applications utilize a contact transfer as preferred over the less accurate transfer of articles over a gap (contactless transfer). Some proposed laser transfer mechanisms discuss transfers over a gap up to 300 µm, while only illustrating results provided for contact transfers.

One very important category of articles to be transferred are integrated circuit "die", or plural "dice". A bare die is a small piece cut (e.g., typically rectangular) from a semiconductor wafer that contains a microelectronic semiconductor device, that is an integrated circuit, also referred to an "IC", or "chip". Alternatively, these die may comprise micro electro-mechanical systems (MEMS) and other devices, or device components, separated from a semiconductor wafer.

In one of the contact mechanisms for transferring bare dice the "etched wafer" is sandwiched between the transfer plate and the receiving substrate. In another contact transfer mechanism the transferred die is beneath and in contact with the polyimide ribbon to which it is transferred. Contact transfer suffers from shortcomings, including: (1) the possibility to mechanically damage the transfer article when bringing it in contact with the receiving substrate; (2) the inability to perform a transfer when other components have already been placed on the substrate; (3) the inability to perform transfers on other than a planar surface; (4) the inability to transfer articles at a high rate because it requires (a) positioning the substrate with the transfer article in the desired location, (b) bringing down the substrate with the article, (c) transferring the article, (d) lifting the substrate. It will be appreciated that steps (b) and (d) are omitted in the contactless transfer.

As seen above, although contactless transfers conceptually have benefits over contact transfers, these have not been realized in practice.

Accordingly, a need exists for a laser transfer method of contactless transfer which overcomes the positioning inaccuracy inherent in present practices.

BRIEF SUMMARY OF THE INVENTION

A method of assembling ultra-thin (e.g., less than about 50 µm thick) articles, such as electronic components, in a laser contactless assembly utilizing an improved laser-induced forward transfer technique. The method is well suited to the assembly of ultra-thin articles, such as semiconductor dice. Although particularly well-suited for use with electronic components, the method can be utilized for assembling other devices, such as components of micro electro-mechanical systems (MEMS) and any other small discrete components. The method is herein referred to as Thermo-Mechanical Selective Laser Assisted Die Transfer (tmSLADT) method.

It should be appreciated that the size of the transfer article can be defined by its: (a) thickness, and (b) the area defined by the length times width, or in the case of square shapes, by the length of the side of the square.

Research and experience have shown that brittle materials, such as silicon, can start becoming flexible when material thickness is reduced to less than 100 µm, and are becoming more truly flexible when the thickness is reduced to less than about 50 µm. Articles thicker than 100 µm are not flexible in the sense described herein (e.g., for use on a flex circuit or similar), and can be easily packaged by conventional methods. A strength of the present invention allows for packaging of ultra-thin dice, and other ultra-thin components or articles with thicknesses of less than 50 µm and, even more particularly less than 30 µm, where other methods have not been demonstrated for packaging such ultra-thin dice.

The present invention can be utilized for handling articles, such as dice, in a wide area range. It will be noted that complications can arise with handling dice on either end of the size spectrum. Small size dice, such as several hundredths of a square mm area, may have insufficient mass for separation from the carrier and transfer over the gap in response to momentum and gravitational forces of the process. When ultra-thin dice are large, such as several square mm or more in area, they can be difficult to handle because of issues with bending and warpage. Examples are provided herein for performing the present inventive transfer for articles having thicknesses of 65 µm, 50 µm, and 25 µm. The present invention provides a gentle transfer mechanism suitable for these ultra-thin articles, with the examples illustrating that the method and apparatus can be practiced across a range of die thicknesses below 100 µm without limitation.

In contrast to many laser-induced forward transfer mechanisms, the methods of the present invention do not rely on the use of a plume of vaporized material from the dynamic release layer (DRL) to transfer the article(s). Instead, the laser beam (e.g., pulse or pulses) creates a blister in the DRL that is thicker than its laser absorption depth, thus confining the vaporized material within the blister. It is the blister that provides a gentle push of the transfer article (die) off of the dynamic release layer, thus separating the article towards the receiving substrate. The DRL, and more particularly the blistering layer thereof, are subject to only a limited non-penetrating ablation, which creates vapors to form a blister, without rupturing the blister. The laser power and thickness of the blistering layer are selected to prevent ablation vapors from bursting the blister and directly contacting the article of transfer. In prior transfer techniques, high laser power values of between 1 and 50 mJ/pulse DRL evaporation were utilized in performing ablative laser transfer. The present invention uses laser power (energy) of much less than 1 mJ to assure that the blisters do not burst during the process. In particular, embodiments of the present invention have utilized less than 20 µJ/pulse in achieving successful transfers. It can be appreciated from this energy value, that the present process is a gentle one in comparison to ablative release processes, whose energy levels can easily shatter ultra-thin semiconductor dice.

The basic concept of this method includes using a dynamic release layer (DRL), such as a dual polymeric release layer, to attach the articles to be transferred to a laser-transparent carrier. The DRL in one embodiment of the invention comprises both a blistering layer and an adhesive layer. The blistering layer preferably comprises a polymer, polyimide, or inorganic material configured for controlled ablation (i.e., not explosively) when irradiated with a laser beam having specific characteristics (e.g., wavelength and pulse energy) and which exhibits appropriate elastic behavior and mechanical strength so that a blister can be formed without rupturing. During the process of laser transfer, the DRL is irradiated by a laser beam, such as preferably a laser pulse or pulses through the laser-transparent carrier. It should be appreciated that the transparent carrier comprises a significantly less flexible material than the DRL layer to assure that the energy of the blister is directed in the desired direction toward the adhesive layer and retained transfer articles, and preventing blister extension in the opposite direction. The laser energy absorbed at the carrier to DRL interface evaporates a small amount of material of the blistering layer, generating gases that create a blister in the DRL without disrupting it. The blister then gently pushes the transfer article off the DRL towards the receiving substrate placed in close proximity.

In order to allow for transfer process optimization, a dual DRL is preferably utilized. The blister response is provided by a blistering layer adjacent to the transparent carrier layer. The blister size and integrity are controlled by the laser beam parameters and the thickness and material properties of the blistering layer. In order to avoid blister rupture during the laser transfer, the blistering layer is thicker than its laser absorption depth. A second layer, an adhesive layer, is deposited on the blistering layer which serves to temporarily bond the article until transfer. The adhesive properties and thickness of this adhesive layer are preferably tightly controlled to regulate the successful non-violent transfer of the article attached to it without damaging it.

It should be appreciated that the DRL may comprise a single layer or multiple layers if they have the appropriate laser absorption, blistering, and adhesion properties. It should be noted that these layers, in particular the absorption layer, may comprise inorganic materials.

The present invention provides a beneficial and novel technique for high-throughput handling and placement of ultra-thin articles, such as bare semiconductor dice. These ultra-thin articles are less than 100 µm and more preferably less than about 50 µm, with the invention being demonstrated to handle articles of significantly less thickness. Although capabilities exist both for placement of ultra-thin dice as well as placement of regular size dice at high rates, there is an unfilled gap when both capabilities are required simultaneously. The laser-assisted transfer method described herein offers numerous benefits when placing ultra-thin discrete components that may not be compatible with traditional pick-and-place equipment. The present invention appears unique in its ability to support high-volume assembly of ultra-thin semiconductor bare dice, beneficial in manufacturing the next generation of mass produced high-density miniature electronic devices. It will be recognized that these small components can be easily damaged during standard "pick-and-place" operations in which release is commonly performed with a metal needle. By contrast to this, the laser release operation of the invention provides a contactless process, which if properly controlled provides safe component assembly on significantly smaller scale parts than pick-and-place capabilities. In view of the foregoing, the tmSLADT process described herein represents an enabling technology as it offers capabilities not otherwise available. It should also be recognized that the tmSLADT process described herein is capable of significantly higher placement speeds, such as placing 100 components per second as compared to placing 2 components per second for conventional pick-and-place machines. The speed increase is thus over an order of magnitude, and nearly two orders of magnitude.

It should be recognized, that the present invention is amenable to performing placement of other devices, components, and structures, including any MEMS elements, or other small size discrete components, that can be attached to the DRL.

In one aspect of the invention, a method of transferring small discrete components uses focused, low-energy laser pulses to create a blister in the DRL at the interface between the DRL and the laser-transparent carrier in response to localized heating. In response to the expansion of the blister the article located on the underside of the DRL is mechanically translated for accurate placement and transfer through an air gap on a receiving substrate. The blister gently pushes the article with a force sufficient to overcome the adhesive force. The force exerted by the blister, in addition to the gravitational force of the transfer article, changes the momentum of the transfer article and initiates the transfer over the gap, Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 1A through FIG. 1B is a schematic of selected laser-assisted transfer according to an embodiment of the present invention, showing laser energy being absorbed by a DRL (FIG. 1A) forming a blister (FIG. 1B) to transfer an article.

DETAILED DESCRIPTION OF THE INVENTION

Figure 2:
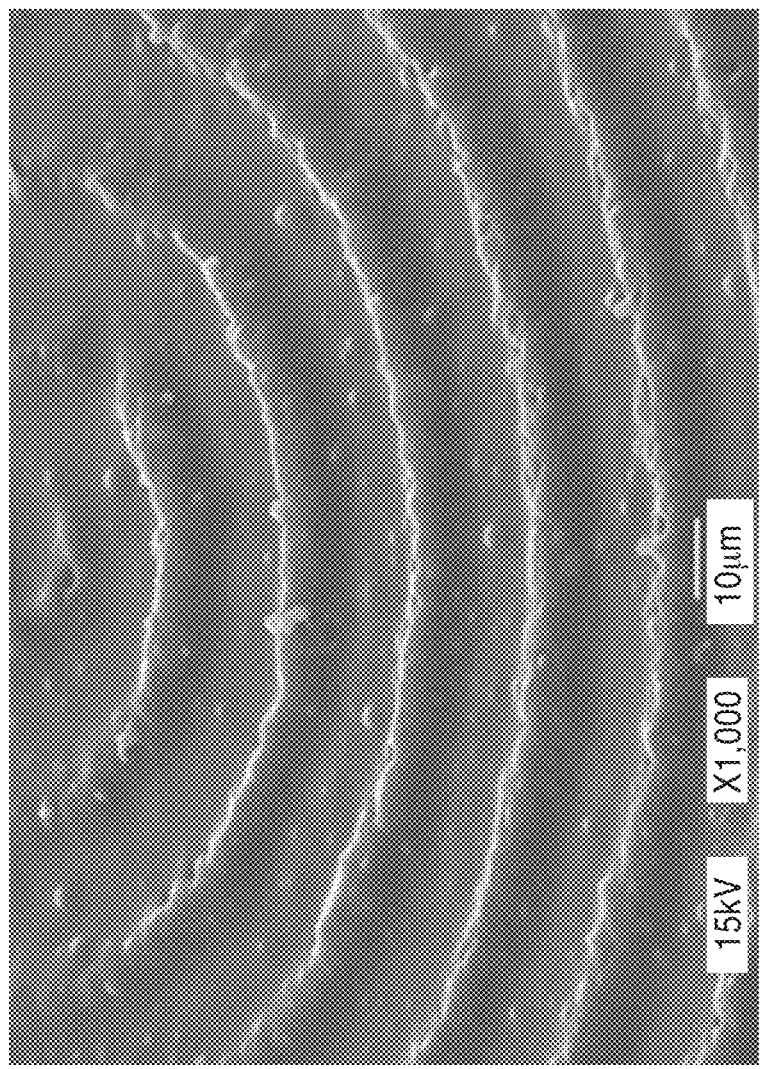
FIG. 2 is an image of a thermo-mechanical (blister) response of DRL according to an embodiment of the present invention when irradiated with a scanning laser beam in a spiral pattern.

Selective laser-assisted transfer of discrete components is well-suited for transferring a variety of solid devices, components or elements. The invention is particularly well-suited in the assembling of very thin and/or otherwise frangible (fragile) microelectronics, such as assembly onto flexible substrates by way of example and not limitation.

Microelectronic devices assembled on flexible substrates, which are based on the placement of ultra-thin components (including semiconductor dice), find new and exciting applications in wearable and low-cost disposable electronics, health care, space applications, MEMS, solar cells, document security, biomedical, and other applications which benefit from flexibility, form fitment, and/or manipulation robust construction.

Flexible electronics are still an evolving and highly dynamic technology area in comparison to traditional electronics packaging technology where discrete electronic components are attached to rigid, laminate-based printed circuit boards using surface-mount and/or through-hole methods. Fabricating a flexible electronic device is more complex than merely replacing the rigid board with a flexible substrate. Bulky, heavy, rigid components, such as the majority of integrated circuit (IC) packages, are not designed for being supported by a thin, flexible substrate. Attaching these to a flexible circuit would compromise the quintessential property of a flexible electronic device—its flexibility. Flexible substrates require not only a small chip, but a flexible chip as well. This can be achieved only if the thickness of the silicon is reduced to less than 100 µm, and more preferably 50 µm or less.

Cost is often of paramount importance when manufacturing disposable electronics, with the cost of the silicon often being the largest contributor to the total cost of a disposable electronic device, such as an RFID tag. It is well known in the trade that the cost of the semiconductor die scales with area raised to the 1.5 to 2 power. Therefore, reducing the die size by half would reduce the cost of silicon by a factor of 8 to 16. Cost depends also on the die thickness. Thinner wafers allow the manufacturer to obtain a higher quantity of slices from an ingot, whereby wafer cost is reduced.

At present, no suitable techniques are available for handling ultra-thin (less than 50 µm thick) bare dice. These dice are very fragile and tend to be easily damaged by "pick-and-place" equipment which is conventionally utilized for direct chip attach. Picking the ultra-thin die from the carrier tape by the "pick-and-place" machine is a challenging task and can easily destroy the ultra-thin die. If the die is not somehow fixed to the carrier tape, stiction may become a problem, especially for components with a characteristic length of less than 300 µm for which the gravitational force may become comparable to the surface forces of attraction. The stiction problem can be alleviated if the dice are fixed to the carrier tape with adhesive. Then the question is how to lift the die from the adhesive film without damaging it. Various approaches explained in the literature use penetrating and non-penetrating needle ejectors as well as thermal release tapes with variable success. The problems do not end with picking the die from the tape. Placement down-force is used to establish contact between the die bumps and the pads on the substrate. The ultra-thin dice are so delicate that the down-force of the placement nozzle often cracks or otherwise mechanically damages the die when it is placed on the substrate.

Flexible electronic products containing ultra-thin dice are used in mass-produced devices where roll-to-roll (R2R) manufacturing is the industry standard for cost-effective production. Each step in the manufacturing process, from the wafer to the final packaging, must be scalable to high volume, low cost manufacturing. The die bonders can process thick dice at a rate of 3000 components per hour. This rate is much lower for precision assembly of ultra-thin dice because placement accuracy and rate are inversely correlated. Although a single-nozzle placement machine may have the precision to place small-size electronic components, this equipment cannot handle ultra-thin dice and similar components at a rate sufficient for high throughput assembly. Therefore, die placement is increasingly becoming the limiting factor on the widespread adoption of cost effective ultra-thin semiconductor dice.

The use of a laser for the transfer and contactless placement of discrete components has been applied to the transfer of semiconductor bare dice (e.g., Si tiles 150 µm thick and 200×200 µm) by ablative means and by gradual thermal heating to weaken areas of adhesive. In ablative techniques, a high-fluence single laser pulse creates a high-velocity jet of evaporated release material that ejects the die at high speed. The less violent thermal process decomposes the release material, in response to gradual heating of the area of the tape that holds the die, until the die literally drops onto the receiving substrate under gravitational force.

One of the major problems with existing laser-assisted transfer techniques is placement precision and accuracy. The ablative releasing method has been found to provide highly unpredictable component transfers and results in a local system which behaves closely to a "confined ablation" configuration. A sacrificial layer is vaporized as it is heated by a laser. The vaporized materials are not confined between the carrier substrate and the bonded component on its surface. The rapidly expanding localized plume of vaporized material projects the transfer component to the adjacent receiving substrate. By the nature of gas dynamics, the use of a relatively low density gas to push a higher density component, such as a semiconductor die, results in a process which is highly sensitive to initial conditions. Small variations in the heat absorption mechanism, irregularities in the sacrificial layer thickness and homogeneity, presence of contamination as well as time based variations in the profile of the laser beam used for ablating the sacrificial layer all contribute to the ablative release process being highly unstable and the results highly unpredictable. Additionally, ballistic component transfer velocities using this approach raise issues regarding the ability of components to land safely on a receiving substrate without sustaining damage.

The gradual thermal release technique is intended to address the transfer volatility and unpredictability observed in the ablative transfer process. Under a gradual thermal releasing configuration, the component to be transferred is prepared in the same way as the ablative releasing sample; however, the sacrificial layer behaves in a different manner. In this case, the sacrificial layer is heated relatively slowly with laser fluences significantly lower than those used in an ablative release. Like the ablative approach, in most cases, the thermal release still relies upon the laser energy being absorbed by the semiconductor component to be transferred. The resulting process includes a gradual heating of the sacrificial layer and provides for a less volatile and more predictable transfer process. The problem with the thermal releasing mechanism is the need to precisely control the process and the release material properties in order to achieve the desired effect. The separation of the die from the softened release layer relies on the gravitational force that has to overcome the forces of attraction acting on the interface between the die and release layer. This transfer can be problematic, or impossible, for dice with a small mass or lower aspect ratio (thickness-to-projected area).

The results of the laser-assisted transfer techniques depend to a great extent on the composition and properties of the layer which bonds the transfer article to the releasing substrate, known as the dynamic releasing layer (DRL). In using ablative techniques, the absorbed laser energy causes a total or partial evaporation of the DRL, with the kinetic energy of the evaporated material utilized to drive component transfer at high speed and subject to damage and imprecision.

The present invention overcomes the problems with both thermal and ablative laser transfer techniques. The DRL compositions of the invention are selected so that the rapid localized heating adjacent the article to be transferred creates a blister of gas in the DRL which mechanically translates the article towards the receiving substrate to effect the transfer.

FIG. 1A through FIG. 1B illustrate an example embodiment 10 of a Thermo-Mechanical Selective Laser-Assisted Die Transfer (tmSLADT) process. This tmSLADT process is particularly well-suited as an electronic packaging technology for high-throughput, low-cost contactless assembly of ultra-thin bare dice and other small components onto rigid and flexible substrates while overcoming the shortcomings of previous die transfer processes.

A solid article for transfer 12 (e.g., die), is adhered to an adhesive layer 20 of a carrier 14. The opposing side of the source material has a laser-wavelength transparent substrate 16. A blistering layer 18 is situated between the transparent substrate 16 and adhesive layer 20. The combination of blistering layer 18 and adhesive layer 20 comprises a dynamic release layer (DRL) 22.

Laser energy 24, such as laser pulse energy, is applied through the laser wavelength transparent substrate 16 which ablates only the thin absorption region of the blistering layer 18 leaving the rest of the layer intact, as well as the adjacent layers. The confined gas of blistering layer 18 exerts a contained expansion force on the surrounding structure (non-vaporized portion of the film). When the pressure inside the layer generates stress in the surrounding layer that exceeds its yield strength, it starts to deform plastically and a blister 26 forms which separates article 12, as seen in FIG. 1B, from the adhesive layer 20 and directs its motion for transfer to another substrate.

It will be noted that since the pressure of the heated expanding gas drops as the volume of the blister increases until a steady state equilibrium is reached. A delicate balance exists in terms of absorbed laser energy, absorbing layer thickness and material properties, which controls whether or not a blister forms, the size of the blister, and finally, whether or not the blister ruptures. It is important that the present invention prevents blister rupture, as upon blister rupture a jet of vaporized material transfers significant and highly variable momentum to the article being transferred, thus resulting in imprecise positional transfer. Since the blister-inducing layer is fully enclosed and contained, the force applied for the transfer is more easily controlled and accurate. In addition, the nonlinear absorption exhibited in semiconductors materials is now removed from the process, which provides a more repeatable and easy to control transfer process.

The single-layer DRL configuration, such as having a 1-10 μm blistering layer (e.g., of polyimide) which has a relatively shallow ultraviolet (UV) absorption depth (e.g., 0.2-0.5 μm), has been found to be very sensitive to the properties of the blister and release layer. It should be noted that the absorption depth should be less than the layer thickness, otherwise ablative transfer will arise. Three types of material properties should be precisely controlled to optimize operation of a single-layer DRL: (1) laser absorption, (2) mechanical properties at elevated temperatures, and (3) adhesive properties. Consequently, a two-part DRL embodiment (e.g., as seen in FIG. 1A through FIG. 1B) was developed and implemented in which the first layer 18, adjacent to the laser-transparent carrier 16, provides the blister mechanism and the second layer 20 (adhesive) is utilized to temporarily bond the transfer component. The dual-layer DRL configuration allows for uniquely formulating bonding layer adhesive strength while causing a minimal, or no, change to the dynamics of blister formation in the underlying absorbing/actuating layer.

It should be appreciated that other blistering materials with appropriate absorbing and elastic characteristics, such as polymeric materials, may be substituted for polyimide. It should also be appreciated that the DRL configuration may comprise additional layers as desired. For example, a layer of highly absorptive material can be placed between the laser-transparent carrier and the blistering layer to generate the blister forming gas. The purpose of this absorption layer is to decouple the laser absorption properties of the DRL from the mechanical elastic properties required to create a blister with the optimal configuration (height, shape, and width).

In describing the laser-transparent carrier, the present invention requires only that the laser-transparent material of the carrier is not opaque, whereby it allows sufficient laser energy to be transmitted to allow formation of the appropriate size blister. Any desired wavelength of laser wavelength transparency can be selected, insofar as properties of the carrier are configured for that wavelength. For example, the wavelength of transparency of the laser-transparent layer of the carrier, and the laser wavelength absorbed by the blistering layer must be compatible with the selected laser wavelength. In other words, the laser frequency and elements of the carrier are selected so that most of the laser pulse energy (e.g., more than 50%, and preferably more than 75%) is transmitted through to the blistering layer and absorbed, (e.g., within a depth of 0.2 to 0.5 μm of the DRL). Typical transmission losses are on the order of 4% reflectance at each surface and bulk absorbance of less than 1% for a transmittance of 91% (0.96×0.99×0.96). The laser pulse energy can be increased or decreased depending on the transmittance of the laser transparent substrate to have the appropriate pulse energy reach the absorbing layer of the DRL. Because of the large mass of the laser transparent substrate relative to the mass of the absorbing DRL layer, heating of the substrate should not be an issue for attenuations up to 25% in the substrate.

In one example embodiment, the laser transparent carrier comprises a 3"×1/16" fused silica disk (Chemglass Life Sciences, part number CGQ-0600-10). The DRL consists of a first blistering layer of spin-on polyimide (PI-2525, HD Microsystems), followed by an adhesive layer of low molecular weight polyester, formulated in house and designated as PE7.

FIG. 2 is a thermo-mechanical (blister) response of DRL when irradiated with a scanning laser beam in a spiral pattern. A magnification of 1000× is shown on the image having a viewing area of about 100 μm.

Figure 3:
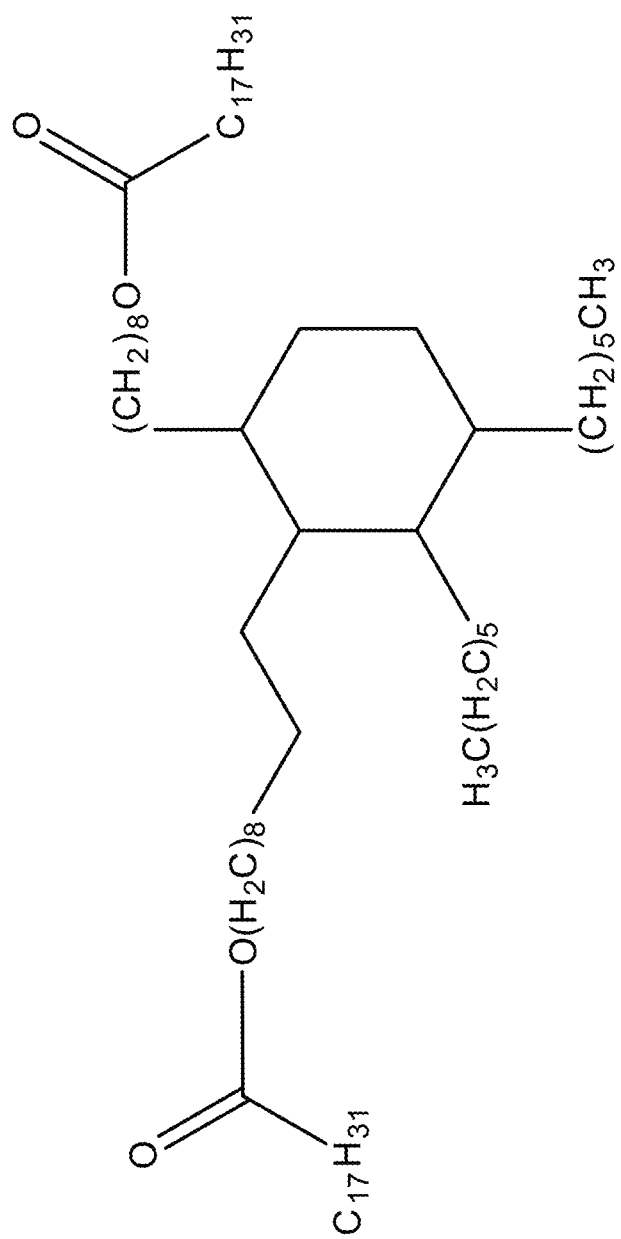
FIG. 3 is a chemical structure diagram for a polymer adhesive material utilized according to an embodiment of the present invention upon which to attach the transfer article to the blistering layer on the laser-transparent carrier.

FIG. 3 depicts the structure of this PE7 low molecular weight polyester adhesive layer which is based on fatty dimer diol and biodiesel. In this demonstration, PE7 was diluted in tetrahydrofuran (THF) to a concentration of 5% by weight. PE7 can be synthesized by charging dimer fatty diol (from Croda Polymer & Coatings) (0.01 mol, 5.70 g), soy biodiesel (From Cargill Inc.) (0.02 mol, 5.54 g), dibutyltin dilaurate (from Sigma-aldrich) (0.05 g), and xylene (20 ml) into a three-necked, round-bottomed flask equipped with a magnetic stirrer, a Dean-Stark trap with a condenser, and gas inlet and outlet. The mixture was heated to 160° C. for 3 hours under nitrogen atmosphere. Xylene and water were removed from the system by distillation. Then the mixture was heated to 230° C. for 5 hours to obtain the yellow, viscous liquid of PE7, with the above process providing a yield of about 97%.

The following description is provided by way of example and not limitation on a demonstration of the current invention. One of ordinary skill in the art will appreciate that fabrication steps are not limited to those described below or elsewhere in the text.

The DRL materials are spin coated on a SUSS RC-8 spin coater. The fused silica disks are first cleaned and dried on the SUSS RC-8 using Tetrahydrofuran (THF). Spin coating of the PI-2525 polyimide layer is carried out as follows: dispense the polyimide on a static substrate and let the polyimide relax, then spin at 500 rpm for 10 seconds (acceleration of 500 rpm/min) followed by 5000 rpm for 40 seconds (acceleration 1000 rpm/min). Curing is achieved in an oven under nitrogen atmosphere as follows: ramp to 120° C. and hold for 30 minutes, then ramp to 350° C. and hold for 30 minutes, cool down gradually to 50° C. or less before exposing to room temperature. The thickness of the polyimide film obtained with these spin-coating and curing parameters was 4 μm which agrees with the spin curves provided by the polyimide manufacturer. The PE7 is also dispensed on a static substrate, but unlike the polyimide, the whole fused-silica disc is coated with the solution prior to spinning. Parameters used for spin coating were 5 seconds spin at 500 rpm (acceleration 500 rpm/min) followed by a 4500 rpm spin for 40 seconds (acceleration 1000 rpm/min).

Commercially mechanically ground to 50 μm thickness (100) p-type Si wafers were utilized in this technology demonstration. The wafer preparation started with sputtering a 2-μm thick Cu layer on top of the wafer, preceded by a 300 Å thick layer of Ti for improved adhesion of the Cu. The discrete components utilized in this demonstration were blank silicon tiles. One would not expect the transfer dynamics of a functional silicon-based IC to differ significantly from a silicon tile with the same or nearly the same dimensions.

The Cu film is patterned using standard lithographic technique into squares with 350, 670, and 1000 μm sides to produce dice with the corresponding dimensions. The Cu and Ti layers in the streets (the space between the dice) is then etched away to expose the wafer.

Next, the wafers are rinsed and dried and placed Cu-side down in a Trion Phantom II RIE Plasma Etcher for backside thinning down to 25 μm. The parameters for both wafer thinning and opening the streets in the next step is shown in Table 1.

The measured etch rate resulting from these parameters was 0.25 μm/min. The wafer thickness was measured using a contact profilometer (KLA Tencor P-11) on a separate control section of the same wafer placed in the etcher adjacent to the processed wafer.

After the wafer was thinned to 25 µm, it was attached to the DRL on a fused silica carrier serving as a laser-transparent carrier. The stack was run through an Optec DPL-24 Laminator to ensure reproducible and evenly distributed bonding pressure between the DRL and the wafer. The laminator parameters were as follows: dwell in vacuum for 7 minutes, then pressurize the chamber and dwell for additional 3 minutes. The pressure of the laminator used was set and non-adjustable.

After the wafer was bonded to the DRL, the wafer is singulated into dice. This was performed utilizing two methods, reactive ion etching (RIE) and laser ablation, thus allowing their respective results according to the present invention could be compared.

The RIE process involved opening the exposed streets using the RIE parameters in Table 1. Half of the sample is protected by a glass slide in order to leave a wafer area for laser singulation and comparison experiments between the RIE etched and laser singulated dice.

A Spectra Physics HIPPO Nd:YVO$_4$ laser operating at 355 nm is used for singulating the other half of the wafer along the wafer streets. The laser was set to a 50 kHz repetition rate, and used at an average power of 3 W, with a pulse energy of approximately 60 µJ. Utilizing a scan speed of about 400 mm/s, 20 scans were required to singulate a die of approximately 25 µm thick.

After laser singulation was completed, the sample was inspected utilizing a backlit optical microscope to ensure complete dicing was achieved. In some cases, nearly complete dicing occurred while small tabs of Si remained intact across the diced streets, which inhibited the transfer process. The desire for full separation must be balanced with the harmful effects of over-scanning during dicing, as laser scanning much beyond that necessary to singulate the wafer affects the properties of the DRL and must be monitored.

A system or apparatus for performing transfer of ultra-thin articles according to at least one embodiment of the invention comprises a carrier configured for retaining an ultra-thin article in preparation for transfer to a substrate (e.g., any desired material) in combination with a laser scanning device. The system can be generally described as: (a) a carrier having a laser-transparent layer, blistering layer, and an adhesive layer to which an ultra-thin article is attached in preparation for a transfer operation; (b) means for outputting a laser beam; (c) means for shaping the laser beam into a pattern; (d) means for directing the laser beam through the laser-transparent layer of the carrier to the blistering layer, proximal the adhesive layer, to form a blister in the blistering layer which deforms the adhesive layer inducing separation of the article (e.g., electronic component dice) from the carrier to any desired receiving substrate.

The means for outputting a laser beam comprises at least one laser device configured for outputting a laser beam, and preferably control electronics for selectively activating the generation of the beam from the laser device. The means for shaping the laser beam into a pattern, comprises one or more optical elements configured for beam shaping, such as selected from the group of optical elements consisting of half-waveplates, polarizers, beam expanders, beam shapers, lenses, and so forth which are known in the laser optical arts. The means for directing the laser beam through the laser-transparent layer of the carrier to the blistering layer comprises beam directing and/or carrier motion control devices, configured to direct the beam to positions on the carrier.

The following describes, by way of example and not limitation, a particular implementation of the system and apparatus.

Figure 4:
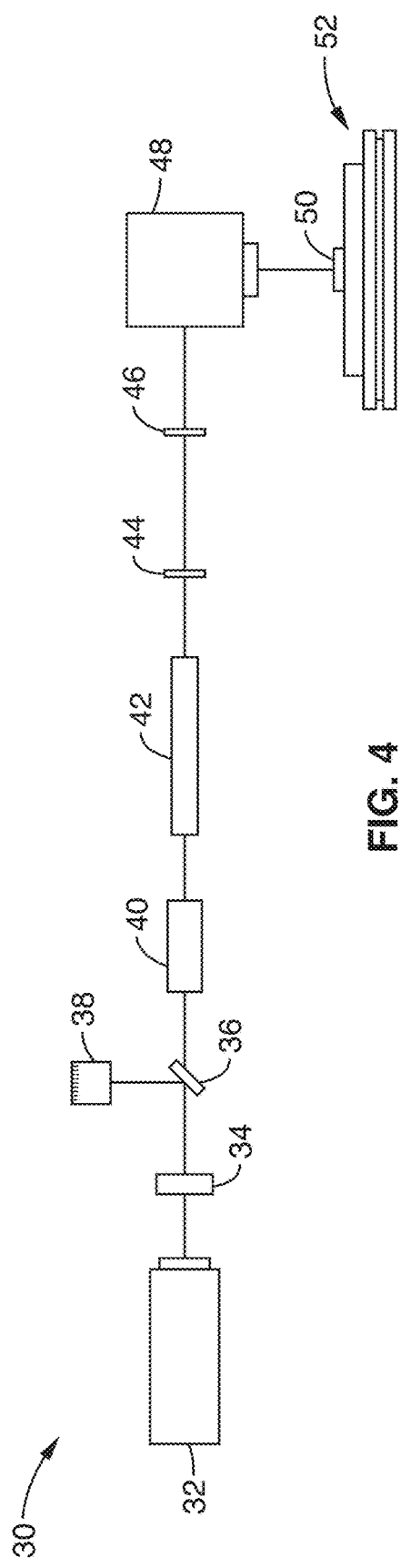
FIG. 4 is a block-diagram of an experimental setup utilized according to an embodiment of the present invention for performing laser-assisted transfer of solid articles.

FIG. 4 illustrates a demonstration setup 30 showing the primary components of the tmSLADT. A laser 32 (e.g., Spectra Physics HIPPO Nd:YVO$_4$) is exemplified having a third harmonic at 355 nm. The laser beam passes through an attenuator comprising a half waveplate mounted in a rotation stage 34 and a dichroic polarizer 36. The half waveplate in the rotation stage 34 and the laser beam polarization direction, perpendicular to the direction of propagation, rotate as the rotation stage is rotated, with the polarization rotating through twice the angle that the waveplate is rotated. When the beam polarization is parallel to the transmission axis of the polarizer, all the light is transmitted. When the beam polarization is perpendicular to the transmission axis, no light is transmitted. For angles in between, the power can be precisely attenuated. The rotational stage is electronically controlled by a means for controlling the rotational stage angular position, such as a LabView® interface (not shown), utilized by way of example and not limitation.

The dichroic polarizer is fixed and has a fixed polarization transmission axis, whereby light transmission varies as the cosine squared of the angle between the polarization direction of light in the laser beam and the polarizer transmission axis.

A power meter 38 is shown for indicating the power which is not transmitted through dichroic polarizer 36.

The beam is expanded through a beam expander 40 and then passes through a refractive beam shaper 42 to attain a top hat profile. A pair of relay lenses 44, 46, enhance the uniformity of the top hat beam profile prior to the beam entering the laser scanhead 48 (SCANLAB HurrySCAN® II).

The scanhead 48 is positioned on a gantry mount and the scanned beam is directed down towards a target 50 (e.g., carrier associated with the invention containing articles for transfer) on an XYZ motion control stage 52. It should be appreciated that the laser can be directed to a position on the carrier by utilizing means for redirecting the laser beam, such as types of scan heads, and/or means for moving the position of the carrier, such as a translation stage, or more preferably a combination thereof as shown in FIG. 4.

Embodiments of the motion control stage provide for moving the carrier in relation to a receiving substrate, while retaining an operable gap over which the articles are transferred between the carrier and receiving substrate. In a preferred motion control stage the carrier and receiving substrate are controlled independently so that an article located in any particular position on the carrier substrate can be transferred to any desirable location on the receiving substrate. Manufacturing control systems are well known for handling one and two dimensional arrays of articles and performing other forms of transfer of these articles from a source to a destination. Typically, these control systems comprise a processor, memory and programming executable on the processor for carrying out the step-and-repeat process by energizing electromechanical actuators in response to positioning sensed by electronic and electromechanical sensors in which timing and control activities are regulated by the programming of the manufacturing control system. It will be appreciated that retention of a gap and performing step and repeat processes, such as under the control of a control system are well known in the art and need not be discussed at length.

Prior to each use, a second power meter can be placed after the scanhead to calibrate the beam power versus waveplate position on the sample. By placing the second power meter at the sample position, the power (pulse energy) on the sample can be calibrated to the angle of rotation of the half wave plate and/or to the power reflected onto the first power meter.

The specific devices shown in FIG. 4 provide each of the means elements described in a prior section. Specifically, means for outputting a laser beam may comprise laser 32. Means for shaping the laser beam in to a pattern, may comprise the combination of optical elements 34, 36, 40, 42, 44 and 46. It will be appreciated by one of ordinary skill in the art that different optical elements and different arrangements can be alternatively utilized for shaping the laser beam pattern, such as to any of the patterns described herein. Means for directing the laser beam may comprise the use of either scanhead 48, or motion control stage 52, but is more preferably and conventionally implemented as a combination of scanhead 48 and motion control stage 52 to provide a very flexible and accurate mechanism for positioning the laser beam pattern on the carrier. The carrier as described previously, is configured for blistering at desired positions, in response to receiving the energy of the laser beam, whereby transfer of articles attached to the adhesive of the carrier proximal that position are transferred.

The carrier substrate and receiving substrate are mounted proximal one another with a desired gap between the two, for facilitating the release of the article from the carrier substrate to the receiving substrate. In a very simple embodiment, the die to be transferred can be selected by positioning the carrier substrate under a stationary laser beam and then firing the laser, thus eliminating the need for a laser scan head.

In a manufacturing embodiment, the mounting of the carrier substrate and receiving substrate are preferably configured for relative motion with one another, such as providing a step-and-repeat process, whereby the articles contained on a carrier at a first spacing (e.g., first pitch and positioning) are separated from the carrier and transferred to a receiving substrate having a second spacing (e.g., second pitch and positioning) at which the articles are to be transferred. For example, motion control of the carrier and receiving substrates is preferably fully independent, and controlled by a system which controls the combination of the laser, optical elements and movements of the stages to perform transfer operations according to the invention.

In one embodiment of the invention, dice attached to a carrier are transferred onto a flexible substrate in a roll-to-roll system. The flexible receiving substrate is advanced in the roll-to-roll operation and the correct dice to transfer selected using the laser scanner. The carrier can be configured for either linear positioning along the role, or for full independent position control.

In one embodiment for demonstrating operation of the system, a wafer is mounted in a fixture used for laser transfer. The wafer in this test embodiment is attached to a carrier, and then singulated (separated into single die) in preparation for transfer to a receiving substrate of any desired material, such as flexible circuit boards, or other circuit boards and/or substrates. Shims of 260 µm thickness were used for the sake of this demonstration to space the receiving and releasing substrates from each other (use of shims or any other physical contact between the two substrates is not required but simplified the setup).

The releasing substrate is placed on top of the receiving substrate with the DRL and singulated wafer facing down. Prior to mounting, the receiving substrate is spincoated with a pressure sensitive adhesive (PSA) and cured in order to provide a means for catching the transferred tiles. Since the average thickness of the wafer used in these samples is 25 µm thick, the transfer gap is about 235 µm.

A receiving substrate with spincoated PSA was used in these demonstrations to determine the capabilities of the laser-transfer process. In a typical electronics packaging application, the receiving substrates would include rigid or flexible printed circuit boards, or other substrates, that provide a means for interconnecting the transferred dice to the other portions of the circuitry.

In yet another embodiment, the transfer articles comprise components of a micro-electro mechanical system (MEMS), such as used for wafer-scale microassembly of MEMS built from parts fabricated on different substrates. In the case of transferring MEMS's components, the receiving substrate provides a location upon which the different components of the MEMS are assembled using the inventive transfer method. For example, the discrete MEMS components can be attached to the carrier substrate individually or they can be fabricated directly from the wafer attached to the carrier substrate by the same methods which are utilized for die singulation.

Once the substrates are mounted, the fixture is positioned under the scanhead for transfer. The laser parameters used for activating the DRL are critical to optimize the transfer rate, and minimize the lateral or rotational displacement of the die during transfer. Operating with pulse energies just below the rupture threshold of the configured transfer setup ensures maximum blister height while still containing the hot gas generated by the vaporized blistering layer material (e.g., polyimide).

In one embodiment, a circular laser scanning pattern is utilized with a high repetition rate, multiple-pulse laser at a scan speed appropriate to create a continuous blister. It will be noted that a continuous blister is a series of overlapping and uninterrupted blisters each formed by a single pulse of the laser. Multiple concentric blisters may be added depending on the size of the article to be transferred. The beam spot size used in this embodiment is less than 20 µm in diameter and the energy per pulse is selected to avoid bursting the blister material, typically less than 20 µLT/pulse. The diameter of the ring blister may be up to the size of the article to be transferred. The third harmonic of a Nd:YVO$_4$ or Nd:YAG laser at 355 nm is used in this embodiment which is absorbed within a 0.2 to 0.5 µm depth of the polyimide blister material.

In another example embodiment, an individual blister with a size smaller than the size of the transfer article and a shape corresponding to the shape of the transfer article is generated by a single-pulse laser.

In another example embodiment, blisters are generated in shapes that contribute to precision placement tailored on the characteristics of the transfer article and the adhesive material used. Examples are spiral blisters, straight line blisters, curved blisters, closed curve blisters, circular blisters, triangular blisters, rectangular blisters, and other geometric shapes and combinations thereof. The above blisters formed in response to one or more associated scanning patterns selected from the group of scanning patterns consisting of straight lines, curved lines, closed curves, circles, triangles, rectangles, and other geometric shapes. It should also be appreciated that at least one embodiment of the present invention incorporates a control circuit for regulating the timing of the blister actuation toward optimizing release dynamics.

In another example embodiment, lasers operating at other wavelengths, such as other harmonics of the Nd:YAG laser or fiber lasers and transparent to the carrier may be substituted for the ultraviolet (UV) laser. It will be appreciated that lasers are available having outputs in the ultraviolet, visible, or infrared portions of the wavelength spectrum. A laser can be utilized in the present invention insofar as the wavelength and energy of a pulse from the laser provides absorption of laser energy sufficient to ablate a part of the material of the blistering layer in order to release vapor for the blister initiation and growth.

In another example embodiment, a diffractive beam splitter is incorporated for generating a pattern of individual blisters using a single pulse laser. A diffractive optical element can be customized to split a single beam into multiple beams to create a two dimensional array of blister to optimize the laser transfer.

In another example embodiment, annular ring blisters are generated using a single pulse laser with an annular ring beam profile using two positive axicons.

Limitations on the demonstration setup utilized did not allow for a single pulse transfer mode or the majority of the other methods described above, whereby three continuous concentric circles were scanned on the back side of the die selected for demonstration of the transfer. The circle sizes depend on the size of the die being transferred. For the 680×680 µm die, the circle sizes were 200, 400, and 600 µm in diameter. The scan pattern started with the smallest circle first and drew each larger circle with a line connecting circles of different diameters. The scan speed was set to 300 mm/s which allowed for subsequent laser pulses to hit the DRL with nearly overlapping edges. This provided a continuous blister along the pattern of the laser scan. The laser repetition rate was set to 15 kHz and the power varied from 150 to 250 mW depending on the characteristics of the DRL. These parameters resulted in pulse energies ranging from 10 µJ to 17 µJ.

Figure 5:
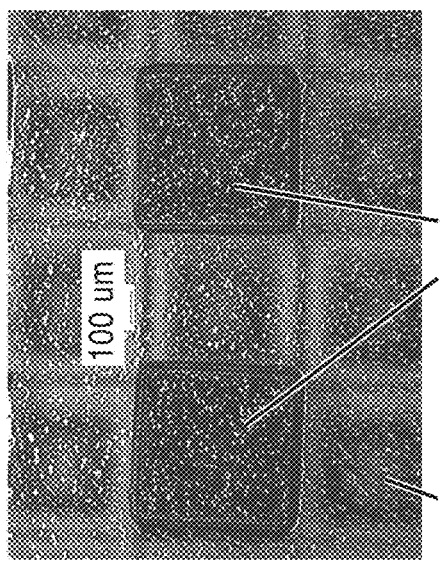
FIG. 5 is an image of two 65 µm thick silicon dice placed according to an embodiment of the present invention.
Figure 6B:
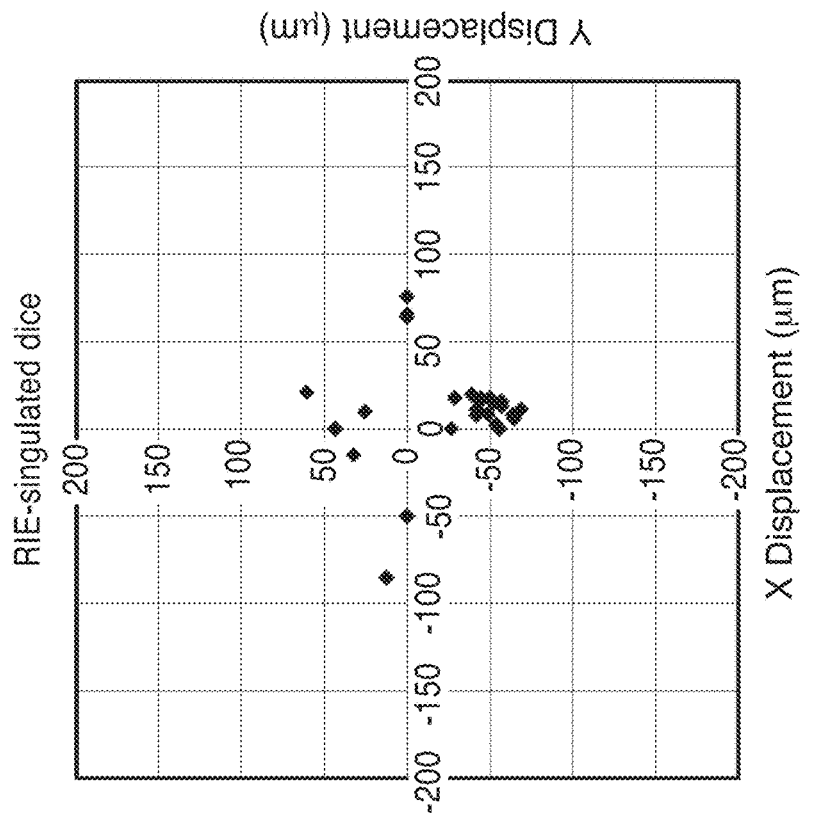
FIG. 6A through FIG. 6B are XY scatter plots of transferred 25 µm thick Si dice according to an embodiment of the present invention, showing lateral displacements in micrometers for laser-singulated and RIE-singulated dice from their release positions.
Figure 6A:
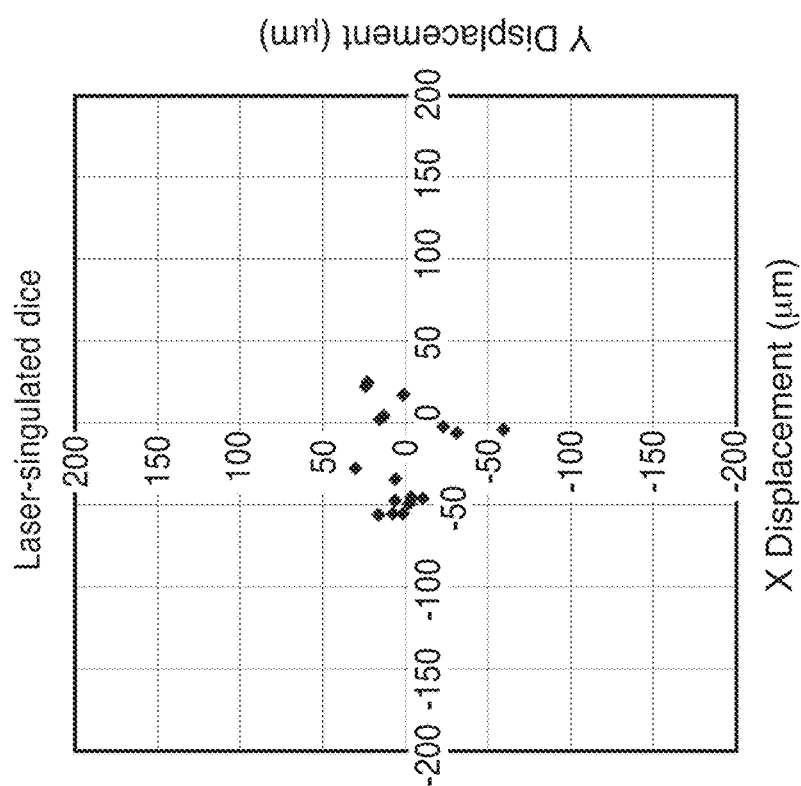

FIG. 5 illustrates a typical result from the laser transfer process of the invention, showing two dice which have been transferred in proper alignment onto a receiving substrate. This image was taken through the transparent receiving substrate. The releasing substrate from which the dice were transferred is in the background FIG. 6A through FIG. 6B depict evaluations of the tmSLADT process showing displacement distances in both X and Y directions for dice subject to laser singulation (FIG. 6A) and RIE singulation (FIG. 6B) of silicon dice that are 670 µm on a side and 25 µm thick. In these evaluations, transfer precision, accuracy, and rate were studied using samples prepared as previously described. Pictures were captured of the transferred dice with an optical microscope to evaluate placement accuracy and precision. The results clearly demonstrated the remarkable transfer precision and accuracy of the tmSLADT process. The mean radial displacement for the laser-singulated dice was 39.2 µm with a standard deviation of σ=14.5 µm. The angular displacements (rotations) of the transferred dice with respect to their original positions were negligible. For the RIE-singulated dice and omitting one outlier, these numbers were 52.7 µm and 13.6 µm, respectively. These results are a significant improvement over those obtained by ablative laser-assisted transfer and are comparable to the thermal laser-assisted transfer process results. The transfer rates in these demonstrations were 85.7% and 93.5% for the laser-singulated and reactive ion etching (RIE)-singulated dice, respectively. It is expected that a well-honed manufacturing process could provide higher transfer yields close to 100%.

Figure 7:
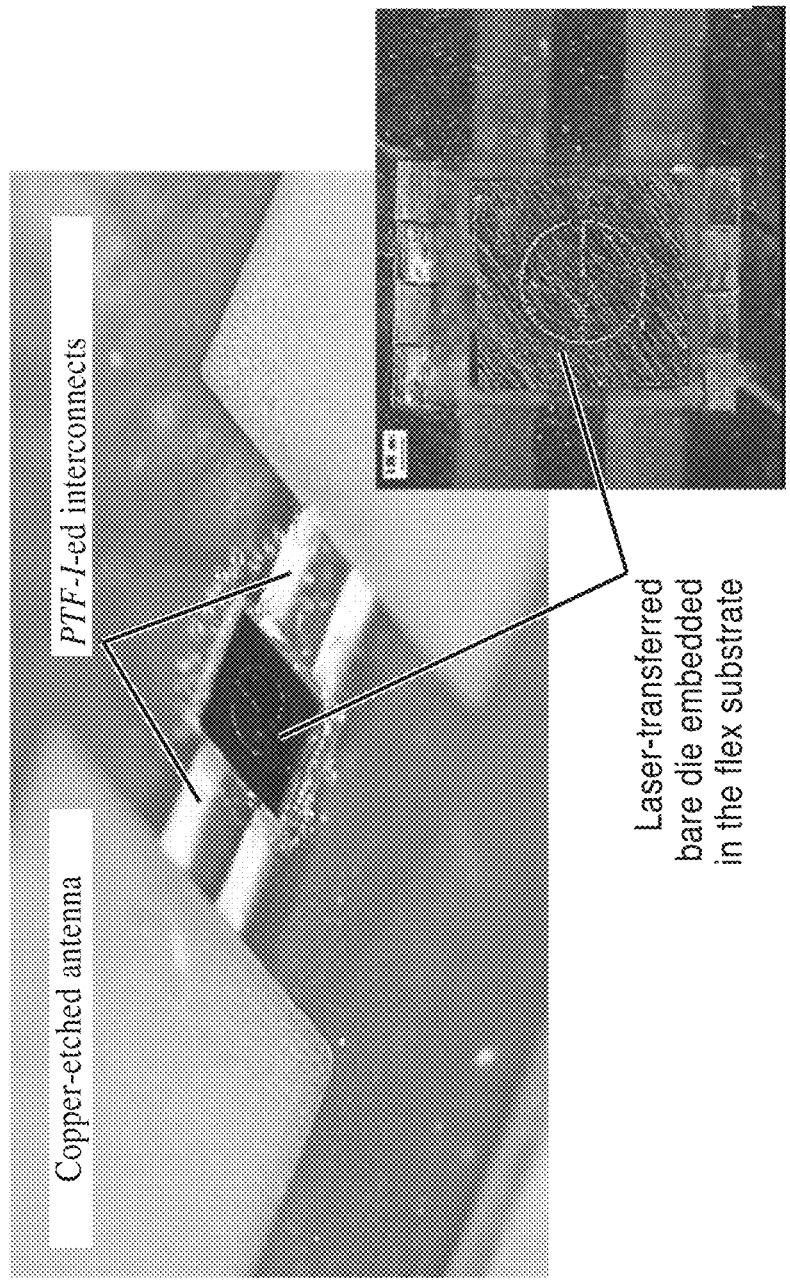
FIG. 7 are images of a functional single-chip device (an RFID tag) as a semiconductor bare die placed according to an embodiment of the present invention, showing the die in a circuit and a close-up inset image.

FIG. 7 are views of a functional laser-transferred and interconnected RFID die as a further demonstration of the invention. The RFID die is shown attached in a circuit, while an inset image shows a close-up of die positioning. By way of example and not limitation, the device is a prototype passive RFID tag (also shown in FIG. 8) with an embedded ultra-thin RFID chip assembled using the present invention. This appears to be the first technology demonstration reported in the literature of a functional electronic device packaged using a contactless laser-induced forward transfer method.

The substrate features, including the pocket receptor for the die and the antenna interconnects, were laser machined in this example using a 248 nm Optec excimer laser system. After micromachining and cleaning the substrate, an adhesive was dispensed at the bottom of the die receptor pocket, for example a small bead of Loctite® 3627™ die attach epoxy about 100 µm in diameter. An RFID die (e.g., Alien Technology HIGGS-3® RFID die) was then laser transferred into the die receptor pocket by means of the tmSLADT method of the present invention.

The die attach epoxy was then cured (e.g., at 125° C. for 6 minutes) to fix the die in place. Next, an adhesive tape (e.g., polyimide tape) was used to secure the die in its pocket. Polyimide tape was used for convenience but may be substituted with a different type of material or omitted. In the next step, the laser machined trenches for the copper-etched antenna interconnects were filled with in-house prepared Ag ink using a process called Polymer Thick Film-Inlaid (PTF-I) and cured (e.g., at 150° C. for 4 hours).

Figure 8:
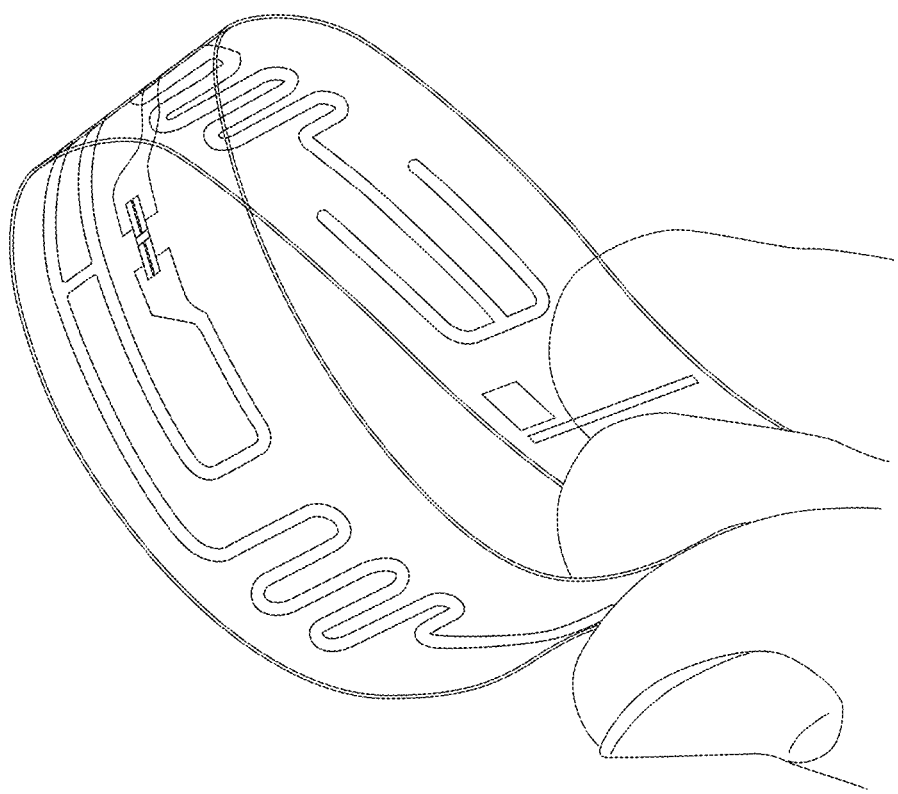
FIG. 8 is an image rendition of a fully functional flexible electronic device (an RFID tag) fabricated according to an embodiment of the present invention, showing its size and flexibility in being readily manipulated in the hand of a user.

FIG. 8 illustrates an example embodiment of an RFID tag, of which five of these RFID tags were prepared following the methods and using the materials described in this application, with and all of them being fully functional and able to communicate with the RFID reader.

Figure 9:
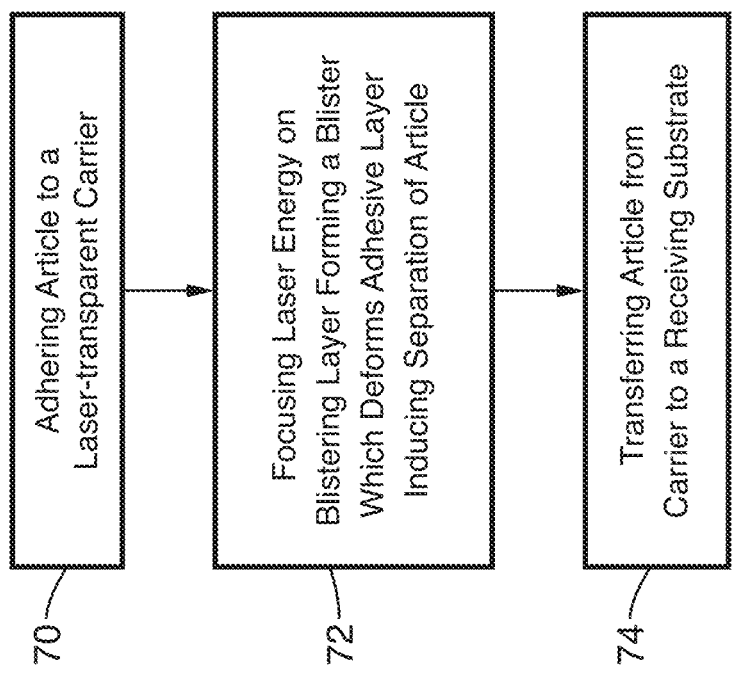
FIG. 9 is a flow diagram of the selective laser-assisted transfer of ultra-thin articles according to an embodiment of the invention.

FIG. 9 is a flowchart of the article transfer process according to the invention. The flow diagram shows step 70 of adhering a component or die as an article to an adhesive layer of a carrier in preparation for inducing separation and performing the transfer process. Separation from the carrier is induced in article 72 in response to focusing a low-energy laser pulse, or pulses, on a blistering layer within the carrier, which is proximal the adhesive layer, to form a blister which deforms the adhesive layer. The blistering layer and adhesive layer comprise a dynamic release layer (DRL). Transfer of article 74 from the carrier to a receiving substrate takes place as the article separates from the adhesive layer in response to blister expansion.

It will be appreciated that ultra-thin components can be easily damaged during standard pick-and-place releasing using a metal needle, while the laser release of the invention is a contactless process that if properly controlled can safely assemble components of a significantly smaller scale. The results demonstrate the unique capabilities of the tmSLADT method and apparatus for assembling ultra-thin articles, including ultra-thin semiconductor dice.

From the discussion above it will be appreciated that the invention can be embodied in various ways, including the following:

1. A method of transferring articles, comprising: adhering an article to an adhesive layer of a laser-transparent carrier; focusing a low-energy laser beam through the laser-transparent carrier on a blistering layer in said carrier, which is proximal said adhesive layer, to form a blister in the blistering layer which deforms said adhesive layer; and transferring said article from said laser-transparent carrier to a receiving substrate placed in close proximity in response to separation of said article as the blister expands.

2. The method of embodiment 1, wherein said blister expands to a substantially fixed distance in response to receiving said low-energy laser beam.

3. The method of embodiment 1, wherein said blistering layer comprises a polymer, polyimide, or inorganic material selected for ablation in a controlled, and non-explosive, manner in response to irradiation with a laser beam of a given wavelength and pulse energy and which exhibits sufficient elastic behavior that a blister can be formed without rupturing.

4. The method of embodiment 1, wherein said blistering layer is subject to ablation that is limited to a non-penetrating ablation creating vapors to form said blister without rupturing said blister.

5. The method of embodiment 1, wherein said blister is formed in response to said low-energy laser beam evaporating a small amount of material from said blistering layer which generates gases that create a blister in said carrier which deforms said adhesive layer of said laser-transparent carrier.

6. The method of embodiment 1, wherein said low-energy laser beam comprises a laser beam output having an ultraviolet wavelength.

7. The method of embodiment 1, wherein said low-energy laser beam comprises a single pulse or series of pulses from a laser.

8. The method of embodiment 1, wherein said low-energy laser beam has a scanning pattern with a high repetition rate and scanning speed selected to create a continuous blister.

9. The method of embodiment 8, wherein said scanning pattern is selected from a group of scanning patterns consisting of straight lines, curved lines, closed curves, circles, triangles, rectangles, and other geometric shapes.

10. The method of embodiment 1, wherein said low-energy laser beam comprises less than 1 mJ of energy to assure that said blisters do not burst during transfer of said article.

11. The method of embodiment 10, wherein said low-energy laser has on the order of 20 µJ of energy per pulse.

12. The method of embodiment 1, wherein material vaporized by said low-energy laser beam are confined to an interior of said blister within said blistering layer.

13. The method of embodiment 12, wherein said ultra-thin article has a thickness of less than 100 µm.

14. The method of embodiment 12, wherein said ultra-thin article has a thickness of less than 50 µm.

15. An apparatus for transferring ultra-thin articles from a carrier to a receiving substrate, comprising: a carrier having a laser-transparent layer, blistering layer, and an adhesive layer to which an ultra-thin article is attached in preparation for a transfer operation; means for outputting a laser beam; means for shaping said laser beam into a pattern; and means for directing said laser beam through said laser-transparent layer of said carrier to said blistering layer, proximal said adhesive layer, to form a blister in the blistering layer which deforms said adhesive layer inducing separation of said ultra-thin article from said carrier for receipt by a receiving substrate; wherein blistering layer thickness exceeds the depth of laser beam absorption to prevent rupturing of the blistering layer.

16. The apparatus of embodiment 15, wherein said ultra-thin article has a thickness of less than 100 µm.

17. The apparatus of embodiment 15, wherein said laser beam is output in an ultraviolet wavelength.

18. The apparatus of embodiment 15, wherein said laser beam comprises a single pulse or series of pulses from a laser.

19. The apparatus of embodiment 15, wherein said means for outputting a laser beam comprises at least one laser outputting a laser beam.

20. The apparatus of embodiment 15, wherein said means for shaping said laser beam into a pattern comprises optical components selected from a group of optical components consisting of half-waveplates, polarizers, beam expanders, beam shapers, and lenses.

21. The apparatus of embodiment 15, wherein means for directing said laser beam comprises a scanhead and/or a translation stage for directing said laser beam at specific positions on said carrier from which said ultra-thin article is to be transferred.

22. The apparatus of embodiment 15, wherein means for directing said laser beam through said laser-transparent layer of said carrier is configured for directing said laser beam to said blistering layer proximal a specific ultra-thin article on said carrier.

23. The apparatus of embodiment 15, wherein said blistering layer is subject to ablation that is limited to a non-penetrating ablation creating vapors to form said blister without rupturing said blister.

24. An apparatus for transferring ultra-thin articles from a carrier to a receiving substrate, comprising: a carrier having a laser-transparent layer, blistering layer, and an adhesive layer to which an ultra-thin article is attached in preparation for a transfer operation; a laser and optical elements for shaping an output of said laser into a desired pattern; and at least one positioning device for directing said laser beam through said laser-transparent layer of said carrier to said blistering layer, proximal said adhesive layer, to form a blister in said blistering layer which deforms said adhesive layer inducing separation of said ultra-thin article from said carrier for receipt by a receiving substrate; wherein said blistering layer is subject to ablation that is limited to a non-penetrating ablation creating vapors to form said blister without rupturing said blister.

25. The apparatus of embodiment 24, wherein said ultra-thin article has a thickness of less than 100 µm.

26. The apparatus of embodiment 24, wherein said laser beam is output in an ultraviolet wavelength.

27. The apparatus of embodiment 24, wherein said laser beam comprises a single pulse or series of pulses from a laser.

28. The apparatus of embodiment 24, wherein said optical elements for shaping said laser beam into a pattern comprises optical components selected from the group of optical components consisting of half-waveplates, polarizers, beam expanders, beam shapers, and lenses.

29. The apparatus of embodiment 24, wherein means for directing said laser beam comprises a scanhead and/or a translation stage for directing said laser beam at specific positions on said carrier from which said ultra-thin article is to be a transferred.

30. The apparatus of embodiment 24, wherein said laser beam has a scanning pattern with a high repetition rate and scanning speed selected to create said blister as a continuous blister.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

| Dry Etch (RIE) Parameters for Si | |
|---|---|
| Pressure (mTorr) | 100 |
| Power (Watts) | 100 |
| Base Pressure (mTorr) | 100 |
| $O_2$ (sccm) | 9 |
| $SF_6$ (sccm) | 26 |
| $CH_3$ (sccm) | 11 |

What is claimed is:

1. A method of transferring articles, comprising:
adhering an article to an adhesive layer of a laser-transparent carrier;
focusing a low-energy laser beam through the laser-transparent carrier on a blistering layer in said carrier, which is proximal said adhesive layer, to form a blister in the blistering layer which deforms said adhesive layer; and
transferring said article from said laser-transparent carrier to a receiving substrate placed in close proximity in response to separation of said article as the blister expands.

2. The method recited in claim 1, wherein said blister expands to a substantially fixed distance in response to receiving said low-energy laser beam.

3. The method recited in claim 1, wherein said blistering layer comprises a polymer, polyimide, or inorganic material selected for ablation in a controlled, and non-explosive, manner in response to irradiation with a laser beam of a given wavelength and pulse energy and which exhibits sufficient elastic behavior that a blister can be formed without rupturing.

4. The method recited in claim 1, wherein said blistering layer is subject to ablation that is limited to a non-penetrating ablation creating vapors to form said blister without rupturing said blister.

5. The method recited in claim 1, wherein said blister is formed in response to said low-energy laser beam evaporating a small amount of material from said blistering layer which generates gases that create a blister in said carrier which deforms said adhesive layer of said laser-transparent carrier.

6. The method recited in claim 1, wherein said low-energy laser beam comprises a laser beam output having an ultraviolet wavelength.

7. The method recited in claim 1, wherein said low-energy laser beam comprises a single pulse or series of pulses from a laser.

8. The method recited in claim 1, wherein said low-energy laser beam has a scanning pattern with a high repetition rate and scanning speed selected to create a continuous blister.

9. The method recited in claim 8, wherein said scanning pattern is selected from a group of scanning patterns consisting of straight lines, curved lines, closed curves, circles, triangles, rectangles, and other geometric shapes.

10. The method recited in claim 1, wherein said low-energy laser beam comprises less than 1 mJ of energy to assure that said blisters do not burst during transfer of said article.

11. The method recited in claim 10, wherein said low-energy laser has on the order of 20 µJ of energy per pulse.

12. The method recited in claim 1, wherein material vaporized by said low-energy laser beam are confined to an interior of said blister within said blistering layer.

13. The method recited in claim 12, wherein said ultra-thin article has a thickness of less than 100 µm.

14. The method recited in claim 12, wherein said ultra-thin article has a thickness of less than 50 µm.

* * * * *